(12) United States Patent
Wei et al.

(10) Patent No.: US 11,627,668 B2
(45) Date of Patent: Apr. 11, 2023

(54) METHOD FOR MANUFACTURING A CIRCUIT BOARD

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Yong-Chao Wei, Qinhuangdao (CN); Po-Yuan Chen, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 63 days.

(21) Appl. No.: 17/331,003

(22) Filed: May 26, 2021

(65) Prior Publication Data
US 2022/0369475 A1    Nov. 17, 2022

(30) Foreign Application Priority Data
May 17, 2021 (CN) .......................... 202110536265.3

(51) Int. Cl.
*H05K 3/46* (2006.01)
*H05K 1/02* (2006.01)
*H05K 3/34* (2006.01)
*H05K 1/11* (2006.01)

(52) U.S. Cl.
CPC ......... *H05K 3/4688* (2013.01); *H05K 1/0298* (2013.01); *H05K 1/111* (2013.01); *H05K 3/34* (2013.01); *H05K 3/4644* (2013.01); *H05K 2201/09372* (2013.01)

(58) Field of Classification Search
CPC .... H05K 3/4688; H05K 1/0298; H05K 1/111; H05K 3/34; H05K 3/4644; H05K 2201/09372; Y10T 29/49126; Y10T 29/49155
See application file for complete search history.

(56) References Cited

U.S. PATENT DOCUMENTS

| | | | | |
|---|---|---|---|---|
| 7,093,356 B2 * | 8/2006 | Imafuji | ............... | H05K 3/4007 |
| | | | | 29/852 |
| 8,797,757 B2 * | 8/2014 | Kaneko | ............... | H05K 3/4682 |
| | | | | 174/262 |
| 8,929,092 B2 * | 1/2015 | Yoshioka | ............... | H05K 3/107 |
| | | | | 29/846 |
| 2016/0225706 A1 | 8/2016 | Cho et al. | | |

FOREIGN PATENT DOCUMENTS

CN          102076180 A      5/2011

* cited by examiner

*Primary Examiner* — Donghai D Nguyen
(74) *Attorney, Agent, or Firm* — ScienBiziP, P.C.

(57) ABSTRACT

A circuit board includes a circuit substrate, a solder, and a surrounding portion. The circuit substrate includes a connecting pad. The solder is formed on a surface of the connecting pad. The surrounding portion is formed on the surface of the connecting pad and cooperates with the connecting pad to form a groove receiving the solder. The surrounding portion surrounds the solder and is spaced from the solder. A method for manufacturing a circuit board is also provided.

8 Claims, 11 Drawing Sheets

METHOD FOR MANUFACTURING A CIRCUIT BOARD

FIELD

The subject matter herein generally relates to a circuit technology, especially relates to a circuit board and a method of manufacturing the circuit board.

BACKGROUND

With the development of the electronic products, sizes of the electronic products are becoming smaller. Correspondingly, an important element in the electronic products, the circuit board needs to be smaller. So that connecting pads and wiring spacings of the circuit board also need to become smaller, which makes coating of solder paste with precisions become more difficult.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
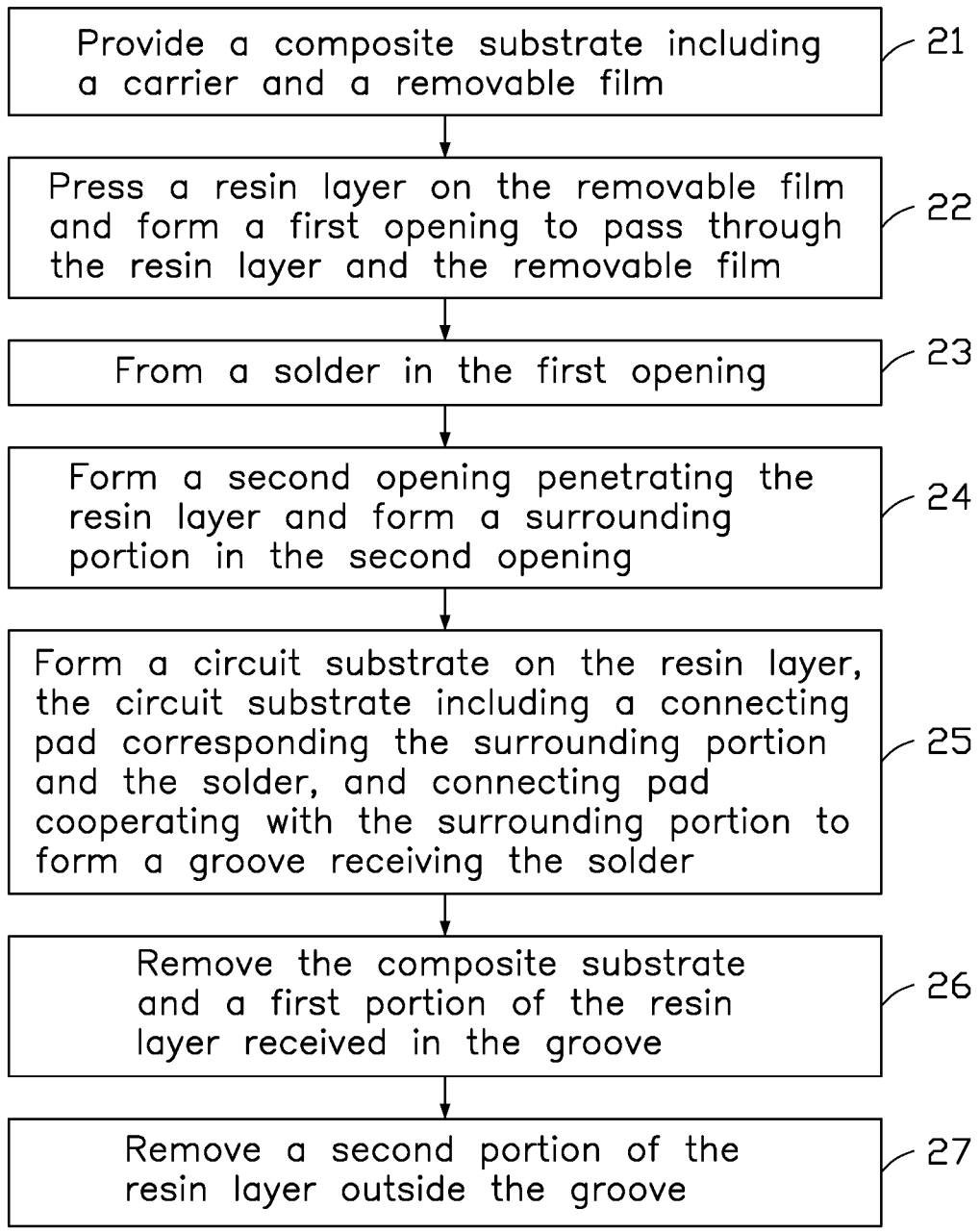
FIG. 1 is a flowchart of a first embodiment of a method for manufacturing a circuit board according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The embodiment method for manufacturing a circuit board is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The embodiment method can begin at block 21.

Figure 2:
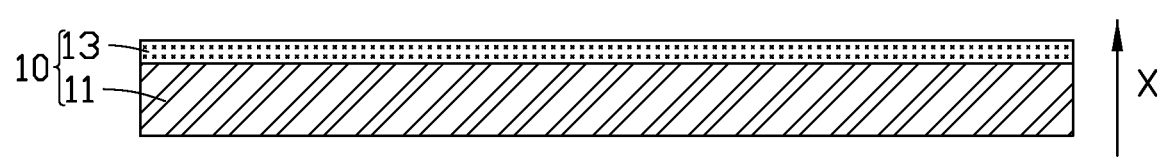
FIG. 2 is a cross-sectional view of an embodiment of a composite substrate according to the present disclosure.

At block 21, referring to FIG. 2, a composite substrate 10 is provided. The composite substrate 10 includes a carrier 11 and a removable film 13 stacked along a first direction X.

The carrier 11 may be made of a material selected from a group consisting of metal, hard resin, glass, and any combination thereof. For example, the carrier 11 may be a metal plate or a glass plate.

Figure 3:
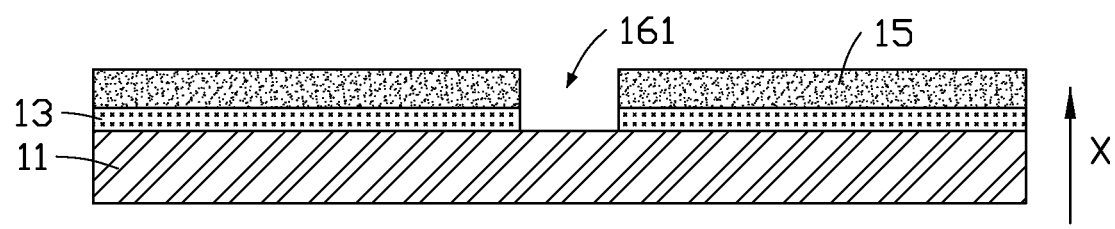
FIG. 3 is a cross-sectional view showing a resin layer and a first opening on the composite substrate of FIG. 2.

At block 22, referring to FIG. 3, a resin layer 15 is pressed on a side of the removable film 13 facing away from the carrier 11, and a first opening 161 is formed to pass through the resin layer 15 and the removable film 13 along the first direction X. A portion of the carrier 11 is exposed from the first opening 161.

Figure 4:
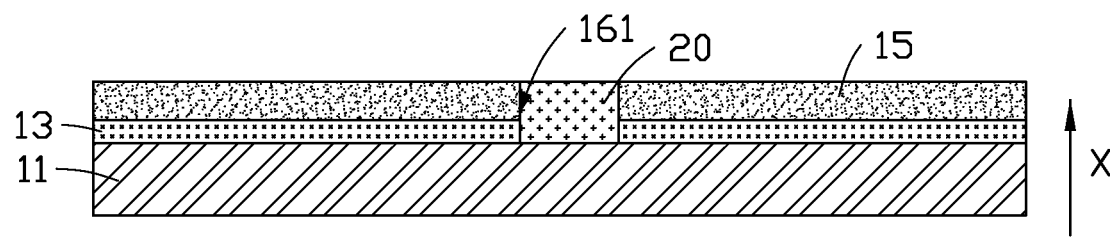
FIG. 4 is a cross-sectional view showing a solder in the first opening of FIG. 3.

At block 23, referring to FIG. 4, a solder 20 fills in the first opening 161.

Preferably, the soler 20 may fully fill in the first opening 161, and a surface of the soler 20 facing away from the carrier 11 may be flush with a surface of the resin layer 15 facing away from the carrier 11.

The solder 20 may be, but is not limited to, solder paste or copper paster.

Figure 5:
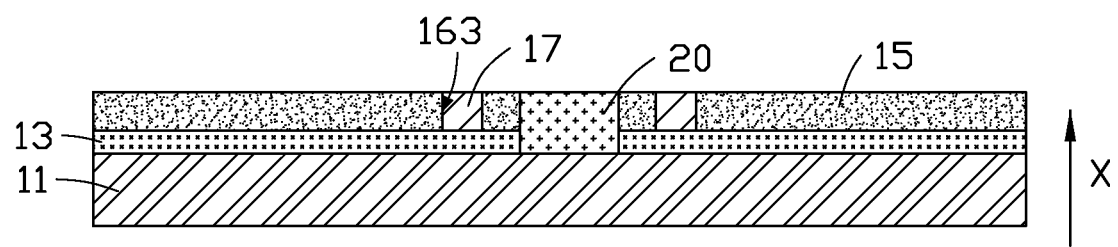
FIG. 5 is a cross-sectional view showing a second opening on the resin layer of FIG. 4 and a surrounding portion in the second opening.

At block 24, referring to FIG. 5, a second opening 163 penetrating the resin layer 15 along the first direction X is formed around the solder 20, and the second opening 163 is spaced from the solder 20. A surrounding portion 17 around the solder 20 is formed in the second opening 163 by plating metal. The surrounding portion 17 is spaced from the solder 20.

Preferably, the second opening 163 may be formed with a center of the solder 20 as a center point to surround the solder 20.

Figure 6:
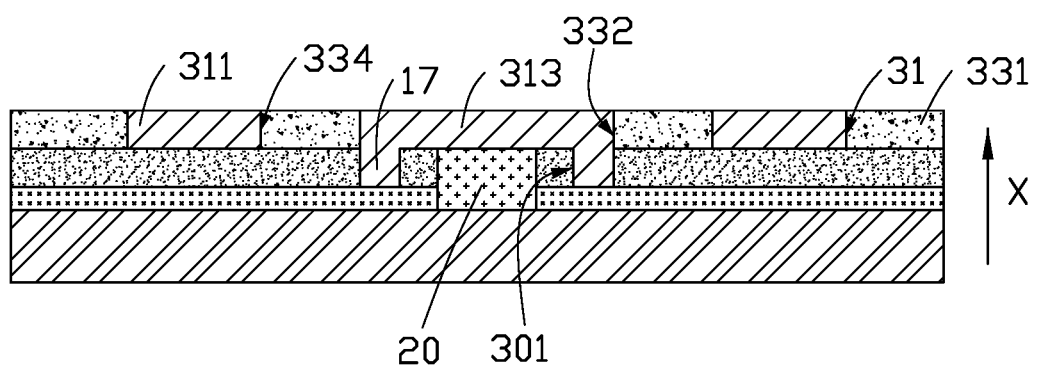
FIG. 6 is a cross-sectional view showing an embodiment of a circuit substrate on the resin layer of FIG. 5.
Figure 7:
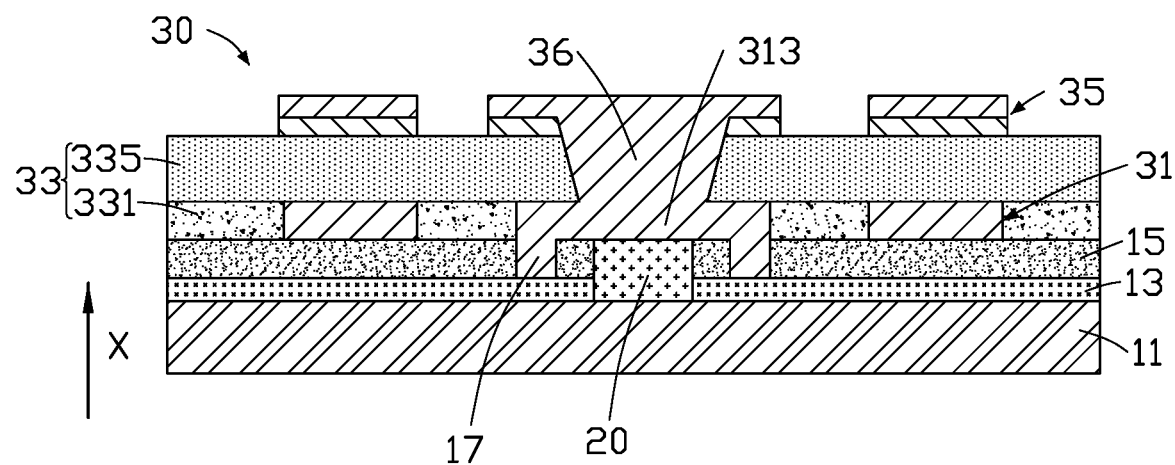
FIG. 7 is a cross-sectional view showing another embodiment of a circuit substrate on the resin layer of FIG. 5.

At block 25, referring to FIGS. 6 and 7, a circuit substrate 30 is formed on the surface of the resin layer 15 facing away from the carrier 11. The circuit substrate 30 includes a first wiring layer 31 combined with the surface of the resin layer 15 facing away from the carrier 11. The first wiring layer 31 includes a connecting pad 313 corresponding the surrounding portion 17 and the solder 20. The connecting pad 313 seals a side of the surrounding portion 17 to cooperate with the surrounding portion 17 to form a groove 301. The solder 20 is received in the groove 301.

The first wiring layer 31 may further include at least one signal line 311 spaced from the connecting pad 313.

The circuit substrate 30 may be a single-layer circuit board, a double-layer circuit board, or a multi-layer circuit board. In at least one embodiment, referring to FIG. 7, the circuit substrate 30 is a double-layer circuit board. Specifically, the circuit substrate 30 may further include a dielectric film 33 and a second wiring layer 35 stacked and spaced along the first direction X. The second wiring layer 35 is electrically connected to the first wiring layer 31, and the dielectric film 33 is interposed between the first wiring layer 31 and the second wiring layer 35.

Figure 8:
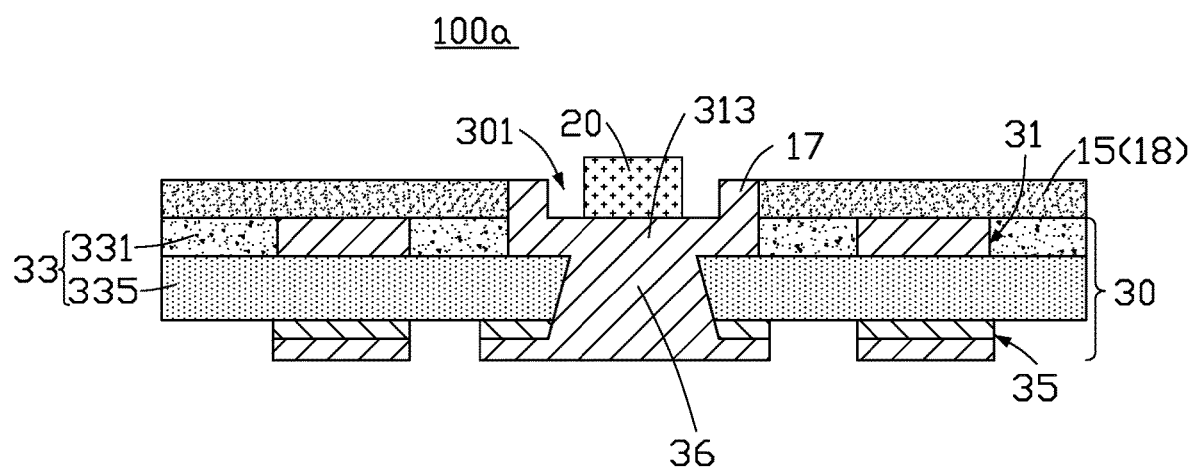
FIG. 8 is a cross-sectional view showing the composite substrate a first portion of the resin layer received in the groove removed from the circuit substrate of FIG. 7.

At block 26, referring to FIG. 8, the composite substrate 10 is removed, and a first portion of the resin layer 15 received in the groove 301 is removed.

In at least one embodiment, a height of the solder 20 is greater than a depth of the groove 301, thereby facilitating an electrical connection between the solder 20 and external electronic components (not shown).

The first portion of the resin layer 15 received in the groove 301 may be removed by, but not limited to, laser ablation followed by plasma removal of scum.

Figure 9:
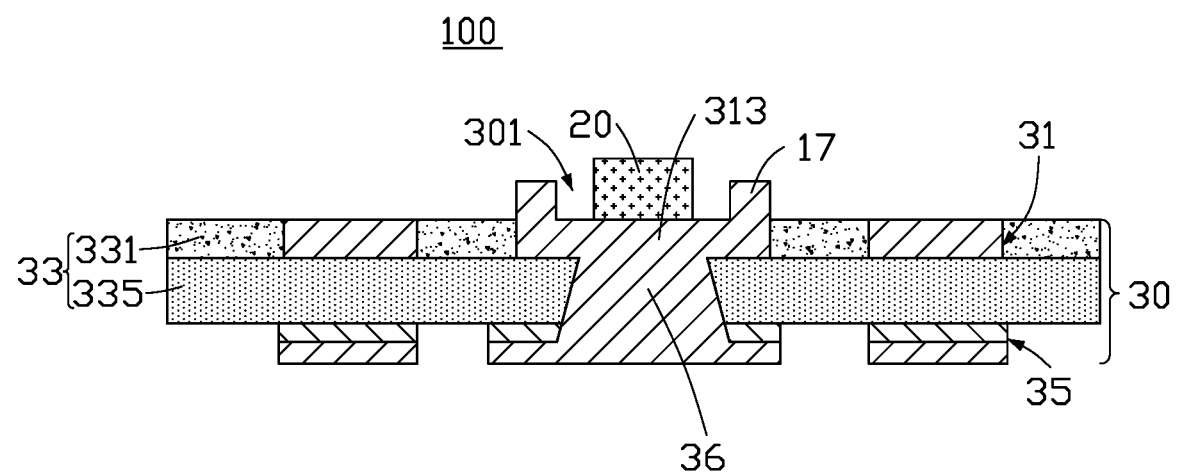
FIG. 9 is a cross-sectional view of an embodiment of a circuit board according to the present disclosure.

At block 27, referring to FIG. 9, a second portion of the resin layer 15 outside the groove 301 is removed, thereby obtaining a circuit board 100.

In at least one embodiment, the block 27 may be omitted. The second portion of the resin layer 15 may be used as a protective layer of the circuit board 100a (shown in FIG. 8) to protect the first wiring layer 31, and there is no need to add a solder mask.

In at least one embodiment, before the block 25, the method may further include roughening the surface of the soler 20 facing away from the carrier 11, so as to increase an adhesive property between a connecting pad 313 subsequently formed and the solder 20.

Figure 10:
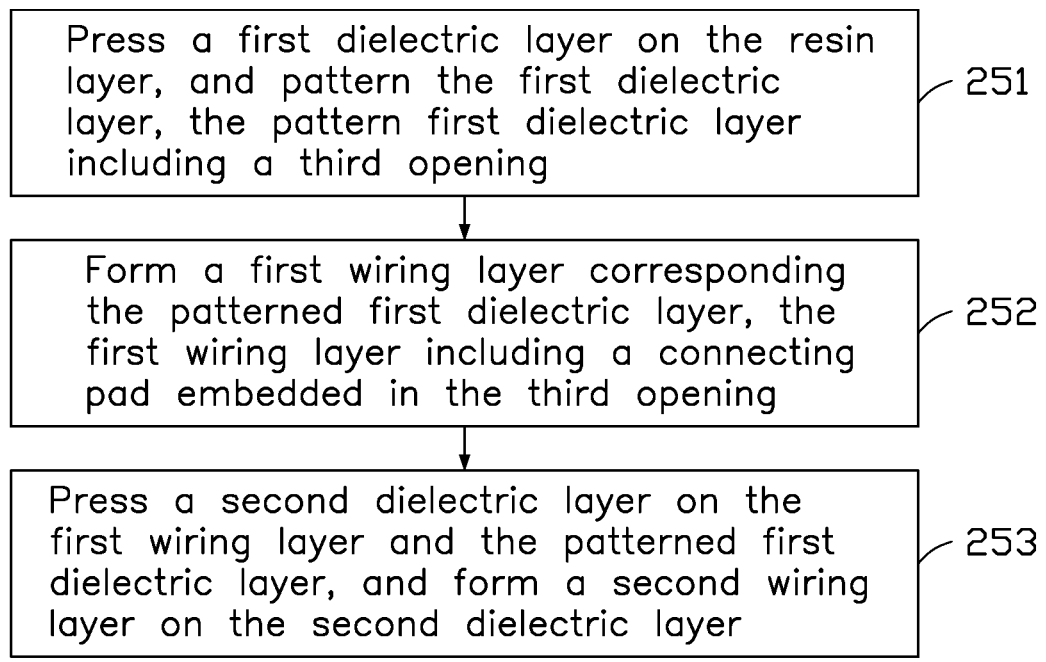
FIG. 10 is a flowchart of an embodiment of a method for manufacturing a circuit substrate according to the present disclosure.

FIG. 10 illustrates a flowchart of an embodiment of a method for manufacturing the circuit substrate 30. The method can begin at block 251.

Figure 11:
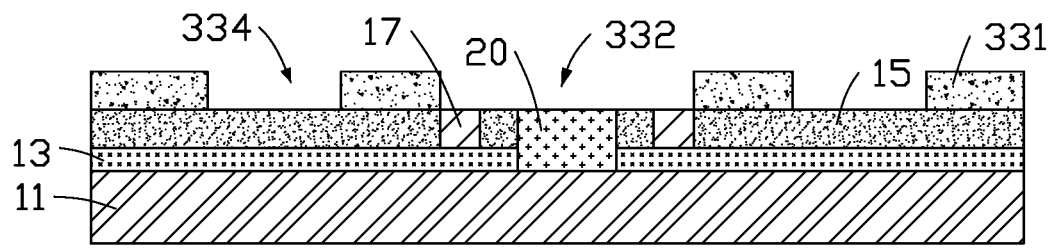
FIG. 11 is a cross-sectional view showing a patterned first dielectric layer on the resin layer of FIG. 5.

At block 251, referring to FIG. 11, a first dielectric layer 331 is pressed on the surface of the surface of the resin layer 15 facing away from the carrier 11 and is patterned. The patterned first dielectric layer 331 includes a third opening 332 corresponding to the surrounding portion 17 and the solder 20. The surrounding portion 17 and the solder 20 are exposed from the third opening 332.

The patterned first dielectric layer 331 may further include at least one wiring opening 334 spaced from the third opening 332.

At block 252, referring to FIG. 6, a first wiring layer 31 corresponding the patterned first dielectric layer 331 is formed to be embedded in the first dielectric layer 331. The first wiring layer 31 includes a connecting pad 313 embedded in the third opening 332.

The first wiring layer 31 may include at least one signal line 311 embedded in the at least one wiring opening 334.

At block 253, referring to FIG. 7, a second dielectric layer 335 is pressed on a side of the first wiring layer 31 facing away from the carrier 11 and a side of the first dielectric layer 331 facing away from the carrier 11, and a second wiring layer 35 is formed on a side of the second dielectric layer 335 facing away from the carrier 11. The second wiring layer 35 is electrically connected to the first wiring layer 31. The first dielectric layer 331 and the second dielectric layer 335 form a dielectric film 33.

In at least one embodiment, the second wiring layer 35 may electrically connected to the connecting pad 313 through a conductive via 36.

In at least one embodiment, a depth of the first opening 161 may be less than or equal to a depth of the second opening 163. The formation of the solder 20 and the formation of the surrounding portion 17 are not limited to the above-mentioned method. In the illustrated embodiment, it is preferable that the depth of the first opening 161 is greater than the depth of the second opening 163.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 9 illustrates an embodiment of a circuit board 100. The circuit board 100 includes a circuit substrate 30, a surrounding portion 17, and a solder 20. The circuit substrate 30 includes a first wiring layer 31 including a connecting pad 313. The solder 20 and the surrounding portion 17 are formed on the connecting pad 313. The surrounding portion 17 cooperates with the connecting pad 313 to form a groove 301 to receive the solder 20. The surrounding portion 17 surrounds the solder 20 and is spaced from the solder 20.

In at least one embodiment, a height of the solder 20 may preferably be greater than a depth of the groove 301, thereby facilitating an electrical connection between the solder 20 and external electronic components (not shown). In at least one embodiment, the height of the solder 20 may be less than or equal to the depth of the groove 301.

A surface of the solder 20 facing the connecting pad 313 may be roughened, which is beneficial to increase an adhesive property between a connecting pad 313 subsequently formed and the solder 20.

In at least one embodiment, referring to FIG. 8, the circuit board 100a may further include a resin layer 18 formed a side of the circuit substrate 30 where the solder 20 is provided, and covering an area of the first wiring layer 31 except the connecting pad 313.

A surface of the resin layer 18 facing away from the first wiring layer 31 may be flush with a surface of the surrounding portion 17 facing away from the first wiring layer 31.

The circuit substrate 30 may be a single-layer circuit board, a double-layer circuit board, or a multi-layer circuit board. In at least one embodiment, the circuit substrate 30 is a double-layer circuit board. Specifically, the circuit substrate 30 may further include a dielectric film 33 and a second wiring layer 35. The first wiring layer 31 is embedded in the dielectric film 33 from a first side of the dielectric film 33. The second wiring layer 35 is formed on a second side of the dielectric film 33 facing away from the first wiring layer 31, and is electrically connected to the first wiring layer 31.

In at least one embodiment, the second wiring layer 35 may electrically connected to the connecting pad 313 through a conductive via 36.

In the above method of for manufacturing a circuit board and the above circuit board, the solder 20 may be accurately arranged in the groove 301, which is beneficial to improve a stability of the connection between the solder 20 and the connecting pad 313. At the same time, the solder 20 is spaced from the surrounding portion 17, which provide a sufficient space for the solder 20 when the solder 20 is melted, thereby reducing a rish of the solder 20 overflowing and contacting other wirings.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
   pressing a resin layer on a composite substrate along a first direction;
   embedding a solder and a surrounding portion in the resin layer from a side of the resin layer facing away from the composite substrate, wherein the solder and the surrounding portion respectively penetrate at least the resin layer along the first direction, the surrounding portion surrounds the solder and is spaced from the solder;
   forming a circuit substrate on the side of the resin layer facing away from the composite substrate, wherein the circuit substrate comprises a connecting pad corresponding the surrounding portion and the solder, the connecting pad seals a side of the surrounding portion to cooperate with the surrounding portion to form a groove, the solder is received in the groove; and
   removing the composite substrate and a first portion of the resin layer received in the groove.

2. The method of claim 1, wherein the composite substrate comprises a carrier and a removable film stacked along the first direction, the resin layer is combined with a side of the removable film facing away from the carrier.

3. The method of claim 2, wherein the method of embedding the solder and the surrounding portion in the resin layer from the side of the resin layer facing away from the composite substrate further comprising:
   forming a first opening penetrating the resin layer and the removable film along the first direction to expose a portion of the carrier from the first opening;
   forming the solder in the first opening; and
   forming a second opening penetrating the resin layer along the first direction, and forming the surrounding portion in the second opening by plating metal, wherein the second opening surrounds the solder and is spaced from the solder, the surrounding portion surrounds the solder and is spaced from the solder.

4. The method of claim 3, wherein after removing the composite substrate and the first portion of the resin layer received in the groove, the method further comprising:
   removing a second portion of the resin layer outside the groove.

5. The method of claim 3, wherein the second opening is formed with a center of the solder as a center point to surround the solder.

6. The method of claim 1, wherein after removing the composite substrate and the first portion of the resin layer received in the groove, the method further comprising:
   removing a second portion of the resin layer outside the groove.

7. The method of claim 1, wherein before forming the circuit substrate on the side of the resin layer facing away from the composite substrate, the method further comprising:
   roughening a surface of the solder facing away from the composite substrate.

8. The method of claim 1, wherein the circuit substrate is a single-layer circuit board, a double-layer circuit board, or a multi-layer circuit board.

* * * * *